US005278856A

United States Patent [19]

Migita et al.

[11] Patent Number: 5,278,856

[45] Date of Patent: Jan. 11, 1994

[54] SEMICONDUCTOR EMITTING DEVICE

[75] Inventors: Masahito Migita, Hachioji; Akira Taike, Kokubunji; Masatoshi Shiiki, Musashimurayama, all of Japan

[73] Assignee: Hitachi, Ltd., Tokyo, Japan

[21] Appl. No.: 811,938

[22] Filed: Dec. 23, 1991

Related U.S. Application Data

[63] Continuation of Ser. No. 469,382, Jan. 24, 1990, Pat. No. 5,081,632.

[30] Foreign Application Priority Data

Jan. 26, 1989 [JP] Japan .................................. 1-14962
Mar. 13, 1989 [JP] Japan .................................. 1-57797

[51] Int. Cl.$^5$ .............................................. H01S 3/19
[52] U.S. Cl. ........................................ 372/45; 257/13
[58] Field of Search ...................... 372/45; 357/17, 16; 257/13, 12

[56] References Cited

U.S. PATENT DOCUMENTS

| | | | |
|---|---|---|---|
| 4,735,910 | 3/1988 | Mitsuyu et al. | 437/22 |
| 4,868,615 | 9/1989 | Kamata | 357/17 |
| 4,916,496 | 4/1990 | Tomomura et al. | 357/17 |
| 4,955,031 | 9/1990 | Jain | 357/17 |
| 5,081,632 | 1/1992 | Migita et al. | 372/45 |

FOREIGN PATENT DOCUMENTS

| | | |
|---|---|---|
| 2613136 | 3/1988 | France . |
| 62101089 | 10/1985 | Japan . |
| 62-211971 | 3/1986 | Japan . |
| 63007692 | 6/1986 | Japan . |
| 63-237590 | 3/1987 | Japan . |
| 63-205920 | 8/1988 | Japan . |

OTHER PUBLICATIONS

Journal of Applied Physics, vol. 57, No. 8, Part 1, Apr. 1985, pp. 2960-2962.
Applied Physics Letters, vol. 52, No. 1, Jan. 4, 1988, pp. 57-59.
Applied Physics Letters, vol. 40, No. 3, Feb. 3, 1982, pp. 246-248.
Japanese Journal of Applied Physics, vol. 25, No. 4, Part 2, Apr. 1986, pp. 279-281.

*Primary Examiner*—Georgia Y. Epps
*Attorney, Agent, or Firm*—Antonelli, Terry, Stout & Kraus

[57] ABSTRACT

A semiconductor emitting device is provided which is capable of emitting a blue light and, which comprises a double hetero junction structure having first clad layer, an active layer and a second clad layer, successively formed on a semiconductor substrate. First and second electrodes are respectively formed on the first and second clad layers. ZnSSe thin films of low-resistivity are preferably used as the first and/or clad second layers, while a ZnSTe film can be used as the active layer.

39 Claims, 9 Drawing Sheets

[H2Se]/[DMZ] FLOW RATE RATIO

CRACKING TEMPERATURE (°C)

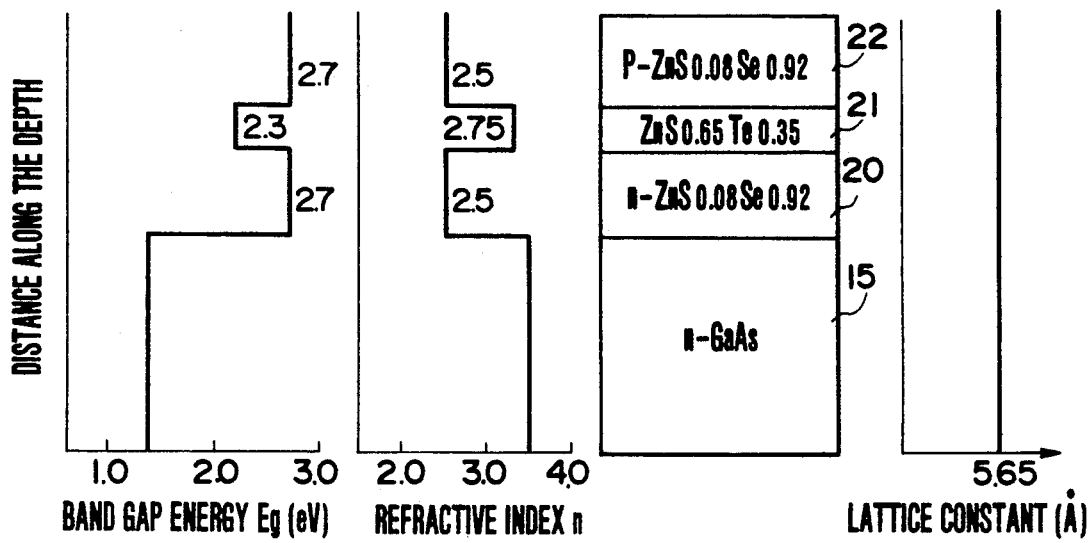
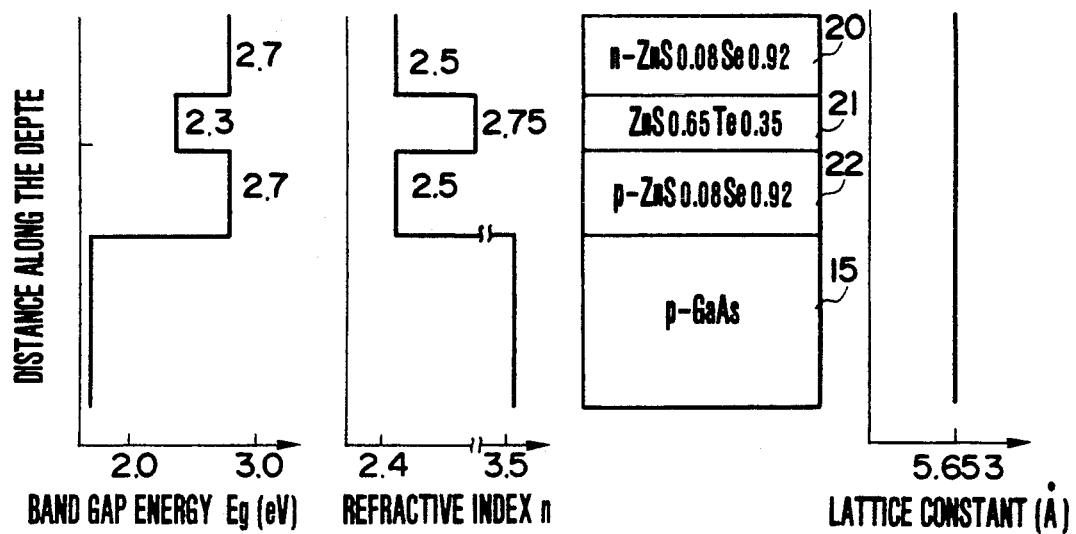

SEMICONDUCTOR EMITTING DEVICE

This is a continuation of application Ser. No. 469,382, filed Jan. 24, 1990, now U.S. Pat. No. 5,081,632.

BACKGROUND OF THE INVENTION

This invention relates to a semiconductor emitting device using a II-VI compound semiconductor of low resistivity and a process for preparing the same.

Conventional semiconductor emitting devices, for example, semiconductor lasers, are in a double-hetero junction structure composed of III-V compound semiconductor materials such as $In_xGa_{1-x}P_yAs_{1-y}/GaAs$, $Ga_xAl_{1-x}As/GaAs$, $In_xAl_{1-x}P/In_yGa_{1-y}P$ ($0 < x$ and $y < 1$), etc. and their emitting wavelength is limited to the infrared region and the visible red region.

On the other hand, semiconductor lasers having an emitting wavelength in visible short-wavelength regions such as the yellowish orange region, the green region and the blue region will have many advantages, if practically utilized. For example, if a blue light semiconductor laser is utilized for an optical disk, the recording density can be increased, and a semiconductor laser of the ultraviolet region over to the green region can make the sensitivity of an optical printer higher. Furthermore, plastic optical fibers, which are regarded as important in short-distance communications, have a high loss in the infrared region and have a low-loss region at about 550 nm. Thus, a green light semiconductor laser has been regarded also as an important light source for short-distance communications. Furthermore, an ultraviolet light semiconductor laser could be applied as a light source for phosphor excitation or as a light source for a process technique using light-sensitive materials or as an experimental light source. Thus, visible light semiconductor lasers having a shorter wavelength than 0.5 μm band have many advantages and their practical applications have been keenly desired. II-VI compound semiconductors such as ZnSSe and ZnSTe have been regarded as blue green and yellowish orange light emitting materials. In order to prepare emitting devices with high efficiency, it is necessary to form n-type and p-type conduction layers with controlled conductivity, that is, low resistivity, particularly a resistivity of not more than 10 Ω-cm, preferably not more than 1 Ω-cm. However, in the past it has been found difficult to form a thin film of p-type II-VI compound semiconductor with a low resistivity owing to the self compensation effect or residual impurity.

Group-I elements and group-V elements are regarded as acceptor impurities of II-VI compound semiconductors. Group-I elements can act as acceptors by substitution at the lattice site of group-II elements, and group-V elements can act also as acceptors by substitution at the lattice site of group-VI elements.

Recently, it was disclosed in Appl. Phys. Lett., Vol 52, No. 1, 1988, p. 57 that a p-type ZnSe thin film having a resistivity of 0.2 Ω-cm, that is, ZnSe doped with Li as group-I element was formed at a substrate temperature of 450° C. by metalorganic vapor phase epitaxy, which will be hereinafter referred to as the MOVPE process.

It was also disclosed in Japanese Patent Application Kokai (Laid-open) No. 63-184373 that a p-type, ZnSSe structure having a carrier concentration of $5.8 \times 10^{15} cm^{-3}$, doped with Li, was formed at a substrate temperature of 500° C. by MOVPE process.

Furthermore, it was disclosed in Jpn. J. Appl. Phys., Vol. 27, No. 5, 1988. p. L909 that a p-type ZnSe thin film was formed at a substrate temperature of 350° C. by doping with N as group-V element by the MOVPE process. The lowest resistivity obtained was $10^2$ Ω-cm and the carrier concentration was $10^{14} cm^{-3}$.

Still furthermore, it was disclosed in Jpn. J. Appl. Phys., Vol. 27, No. 11, 1988, p. L2195 that a p-type ZnSSe thin film having a resistivity of 21.9 Ω-cm and a carrier concentration of $7.2 \times 10^{15} cm^{-3}$ was formed at a substrate temperature of 500° C. by doping with N by the MOVPE process.

When group-I elements such as Li and Na are used as acceptor impurities in the above-mentioned prior art, deterioration of electric properties of p-type ZnSSe thus prepared is considerable owing to the large diffusion constants of these atoms in the ZnSSe lattice, and the life of p-n junction prepared therewith is short. There is also a problem in the reproducibility. When these group-I elements are interstitially incorporated, they act as donors on the contrary and thus p-type conductivity control is hard to accomplish.

When N (nitrogen) is used as a dopant, a stable thin film with less time-evolution can be obtained, but it is difficult to make the resistivity lower than 20 Ω-cm. It is usual to conduct doping with $NH_3$ in a source molar ratio of group-VI element/group-II element of 5 to 100, that is, by supplying the group-VI source in excess of the group-II element source, and in that case the nitrogen atoms are hard to make substitution at the sites of selenium atoms in the p-type ZnSe thin film and it is also necessary to use such a large amount of group-V nitrogen dopant source as 100 times the amount of group-VI element source for reducing the resistivity approximately to $10^2$–$10^3$ Ω-cm. This also causes to deterioration in crystallinity.

As explained above, p-type, II-VI compound semiconductor thin films of low resistivity with less deterioration have not been formed with good reproducibility, and thus semiconductor emitting devices having a p-n junction or a double-hetero junction structure have not been obtained.

SUMMARY OF THE INVENTION

An object of the present invention is to provide a semiconductor emitting device having emitting wavelengths of blue, green and yellowish orange lights with high reliability, and a process for preparing the same.

Another object of the present invention is to provide a p-type $ZnS_xSe_{1-x}$ of low resistivity, where $0 \leq x < 1$, for realizing the above-mentioned semiconductor emitting device, and a process for preparing the same.

These objects can be attained by using a p-type semiconductor layer having a carrier concentration of not less than $1 \times 10^{16} cm^{-3}$ and a resistivity of not more than 10 Ω-cm at room temperature, doped with nitrogen and represented by the formula $ZnS_xSe_{1-x}$, where $0 \leq x < 1$, as a p-type semiconductor layer in the semiconductor emitting device.

Furthermore, these objects can be obtained by forming the above-mentioned $ZnS_xSe_{1-x}$ thin film on a semiconductor substrate by introducing a group-II element source (Zn) together with group-VI element (S and Se) and a nitrogen-containing dopant as molecular beams in such a source molar ratio of group-II element to group-VI elements that the crystal growth rate is limited by an amount of supply of the group-VI sources.

BRIEF DESCRIPTION OF THE DRAWINGS

FIGS. 8A, 10A, 12A, 13A, 14A and 15A are diagrams showing the band gap energy of semiconductor layers constituting a double-hetero junction structure according to embodiments of the present semiconductor laser.

FIGS. 8B, 10B, 12B, 13B, 14B and 15B are diagrams showing the refractive index of a semiconductor layers constituting a double-hetero junction structure according to embodiments of the present semiconductor laser.

FIGS. 8C, 10C, 12C, 13C, 14C and 15C are diagrams showing the cross-section of a double-hetero junction structure according to embodiments of the present semiconductor laser.

FIGS. 8D, 10D, 12D, 13D, 14D and 15D are diagrams showing the lattice constant of semiconductor layers constituting a double-hetero junction structure according to embodiments of the present semiconductor laser.

DETAILED DESCRIPTION OF THE PREFERRED EMBODIMENTS

At first, description is made of a process for forming a p-type $ZnS_xSe_{(1-x)}$ compound semiconductor thin film of low resistivity.

Figure 1:
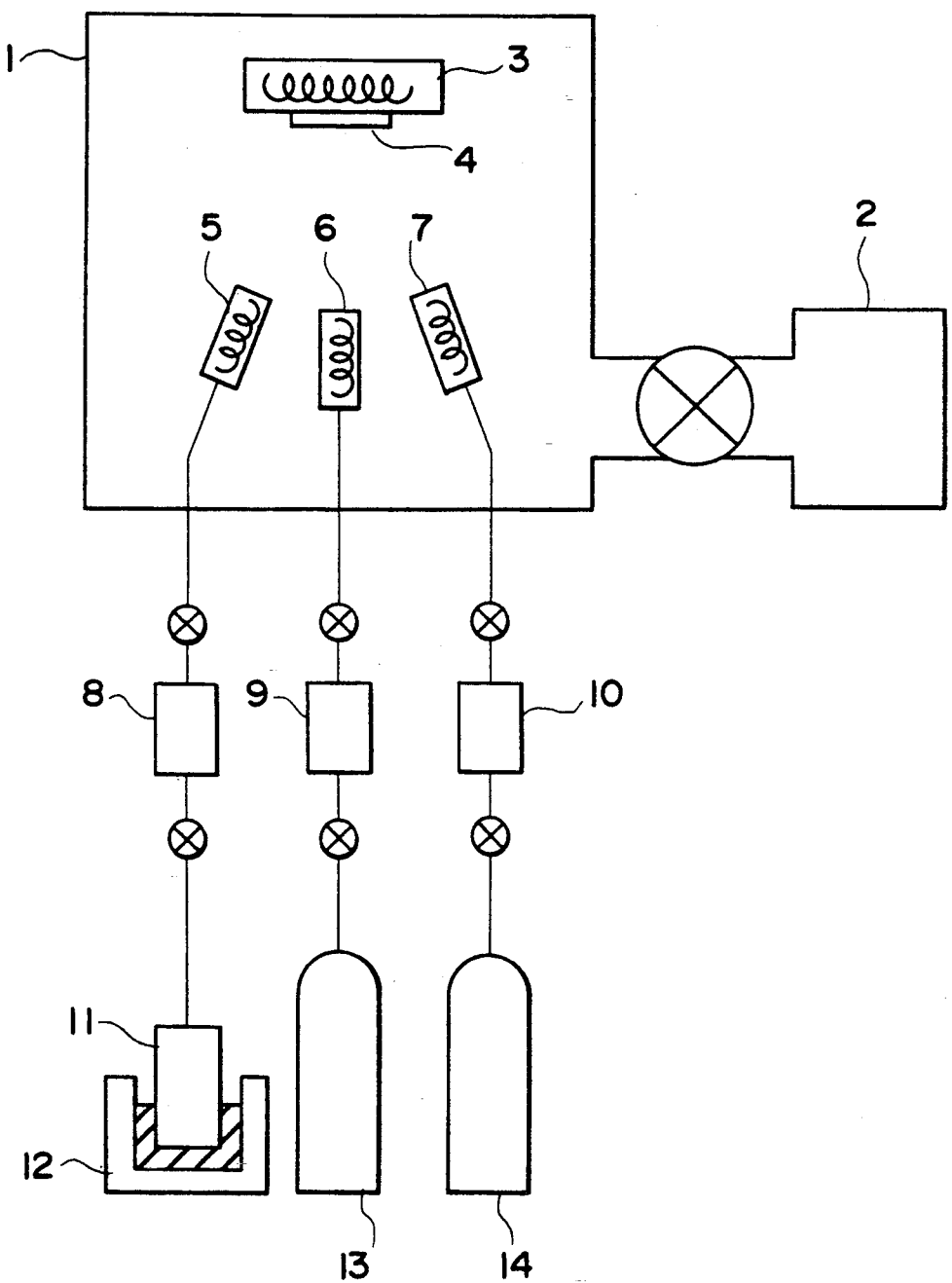
FIG. 1 shows one example of a metalorganic molecular beam epitaxy (MOMBE) apparatus for forming a p-type ZnSSe thin film of low resistivity.

FIG. 1 outlines an organometal molecular beam epitaxy (MOMBE) apparatus used for forming the above-mentioned compound semiconductor thin film. A chamber 1 is evacuated to an ultra high vacuum by an evacuating pump 2. In the chamber 1, a substrate 4 supported on a susceptor 3 and gas-cells 5, 6 and 7 are provided. Raw material gases are introduced from a babbler 11 kept at a predetermined temperature by an electric temperature controller 12, and gas cylinders 13 and 14 to gas-cells 5, 6 and 7 through mass flow controllers 8, 9 and 10. respectively, and the gases are discharged toward the substrate 4 through the gas-cells. The susceptor 3 can be heated up to 800° C. by resistive heating. The gas-cells 5, 6 and 7 can be heated up to 1,000° C. by resistive heating and can be decomposed in advance before the gases reach the substrate.

In the above-mentioned MOMBE apparatus, dimethyl zinc $[(CH_3)_2Zn]$, which will be hereinafter referred to as DMZ is supplied as a group-II source from the babbler 11, hydrogen selenide ($H_2Se$) as a group-VI source from the gas cylinder 13 and ammonia ($NH_3$) as a group-V dopant source from the gas cylinder 14. GaAs is used as the substrate 4 and the individual raw material gases are introduced into the growth chamber through the gas-cells heated to 350° C. to make crystal growth of ZnSe:N film. The characteristics of the film are all measured at room temperature.

Figure 2:
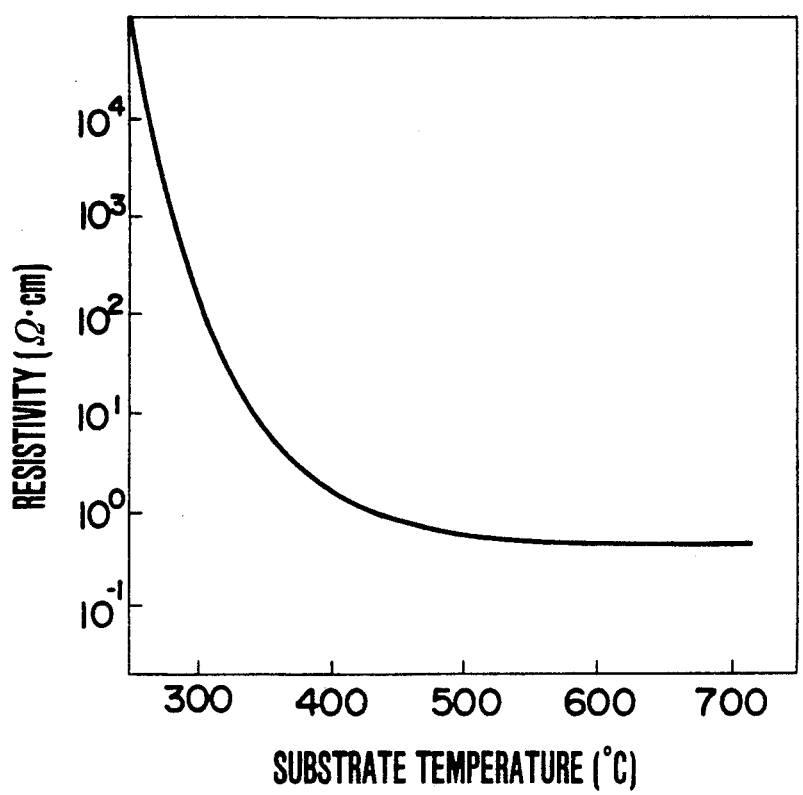
FIG. 2 is a diagram showing a relationship between the substrate temperature and the resistivity of undoped n-type ZnSe thin film.

FIG. 2 shows a relationship between the substrate temperature and the resistivity when an undoped ZnSe film was prepared only from DMZ and $H_2Se$. The resistivity was determined by Hall measurement. Flow rates of DMZ and $H_2Se$ were 20 and 43 μmol/min, respectively. Under this condition, the growth rate is limited by an amount of supply of the group-VI element source, and the conductivity of undoped ZnSe was n-type, because vacancy is liable to occur at the lattice sites of group-VI atoms under the excessive group-II element source condition, and the Se vacancy acts as a donor. The resistivity is lowered with increasing substrate temperature, and it seems that Se atoms of high vapor pressure is more easily re-evaporated and the number of Se vacancies is increased.

Figure 3:
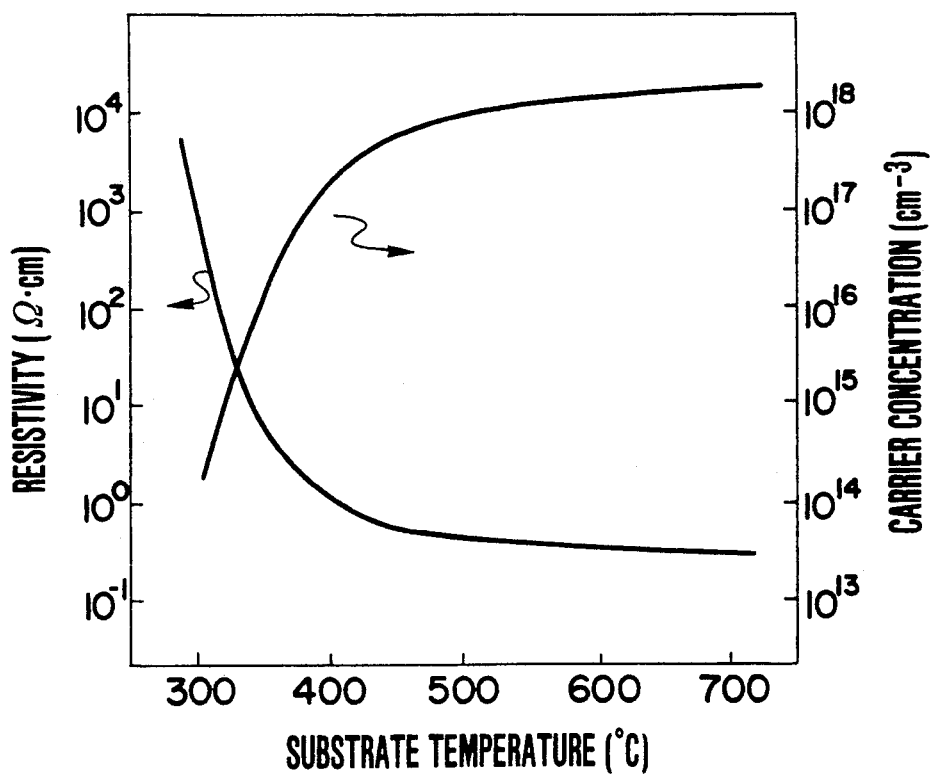
FIG. 3 is a diagram showing a relationship between the substrate temperature and the resistivity or the carrier concentration of nitrogen-doped p-type ZnSe thin film.

FIG. 3 shows a relationship between the substrate temperature and the resistivity or the carrier concentration when a nitrogen-doped ZnSe film was prepared by using $NH_3$ as a dopant source. Flow rates of DM2, $H_2Se$ and $NH_3$ were 20, 43 and 43 μmol/min., respectively, and the pressure was $2\times10^{-4}$ Torr during the growth. The conductivity of ZnSe was p-type, and a carrier concentration of $10^{16}cm^{-3}$ or more and a resistivity of not more than 10 Ω-cm were obtained at a substrate temperature of 350° C. or higher. A resistivity of not more than 1 Ω-cm preferable for forming a semiconductor emitting device utilizing a p-n junction could be realized at a substrate temperature of 400° C. or higher, because substitution of the group-V dopant element is more liable to take place at the lattice sites of group-VI element with increasing substrate temperature under the excessive group-II element source condition and the group V dopant element acts as an acceptor.

Figure 4:
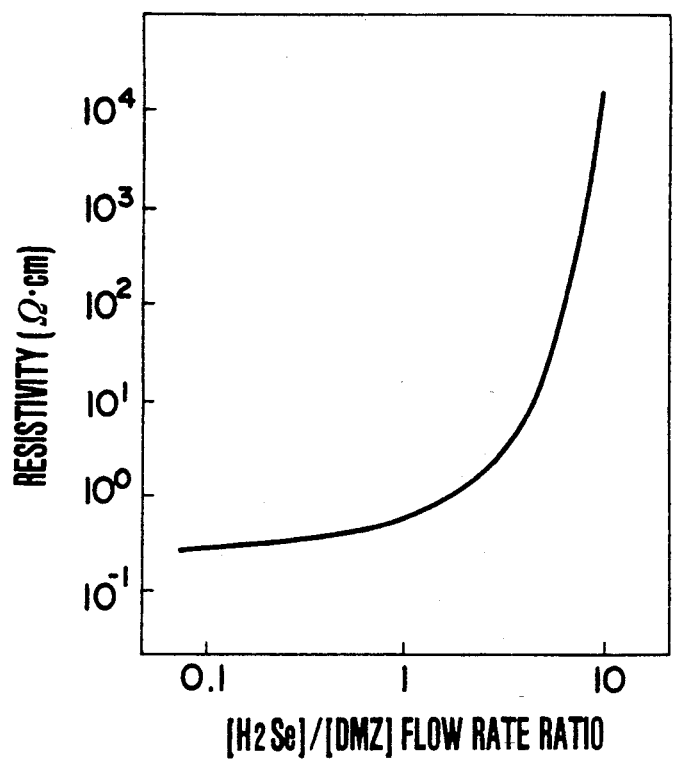
FIG. 4 is a diagram showing a relationship between the source molar ratio of group-VI element/group-II element and the resistivity of nitrogen-doped p-type ZnSe thin film.

FIG. 4 shows a relationship between the flow rate ratio of a group-VI element source/group-II element source and the resistivity when a ZnSe film was prepared by changing the flow rate of DMZ while keeping the flow rates of $H_2Se$ and $NH_3$ constant at a substrate temperature of 400° C. The conductivity of the ZnSe was p-type. A resistivity of not more than 10 Ω-cm was obtained in a flow rate ratio of group-VI element source/group-II element source of 5 or less, because the condition corresponded to the excessive group-II element source condition and substitution of the group-V dopant element was more liable to take place at the lattice sites of group-VI element.

Then, crystal growth of a ZnSe film was made on a GaAs substrate by using triethylamine $[N(C_2H_5)_3]$ as dopant source in place of ammonia, where DMZ was used as a group-II element source and hydrogen selenide ($H_2Se$) as a group-VI element source.

Figure 5:
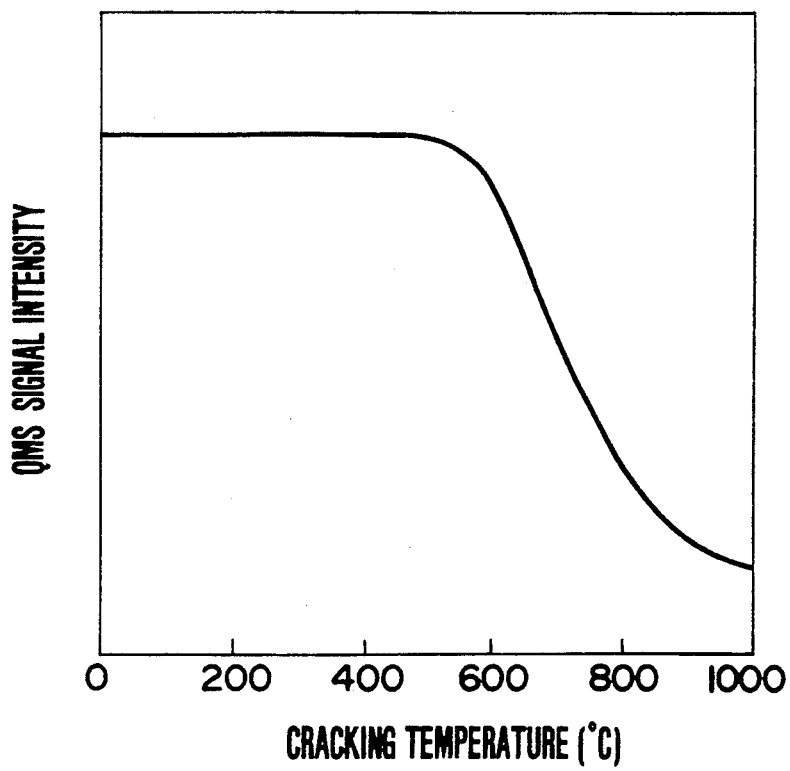
FIG. 5 is a diagram showing the cracking characteristics of triethylamine.

FIG. 5 shows cracking characteristics of triethylamine in a gas-cell, where the peak intensity of triethylamine was measured by a quadrupole mass spectrometry (QMS) while changing the temperature of triethylamine gas-cell. It is apparent from FIG. 5 that triethylamine starts to decompose at about 500° C. and is completely decomposed at 900° C. or higher.

The temperature of triethylamine gas-cell was set to 790° C. and the temperatures of DMZ gas cell and H$_2$Se gas-cell were set to 350° C. The conductivity of a ZnSe film grown at a substrate temperature of 450° was p-type at flow rates of DMZ, H$_2$Se and triethylamine of 20, 43 and 30 μmol/min. respectively, and the carrier concentration was $5.0 \times 10^{17}$ cm$^{-3}$ and the resistivity was 0.8 Ω-cm. When the substrate temperature and the source molar ratio of group-VI element source/group-II element source were changed, change in the resistivity had a similar tendency to that when NH$_3$ was used as a dopant source.

When diethylamine [NH(C$_2$H$_5$)$_2$] was used, diethylamine decomposed at a gas-cell temperature of 950° C. and the resistivity changed in the same manner as that in the case of triethylamine.

A nitrogen-doped ZnS$_x$Se$_{1-x}$ layer was formed as a p-type semiconductor layer on an n-type GaAs substrate by MOMBE process, where $0 \leq x < 1$. DMZ, H$_2$S and H$_2$Se were used as a Zn source, a S source and a Se source, respectively, and NH$_3$ was used as a p-type dopant source. The resistivity and carrier concentration of the thus obtained p-type ZnSSe thin film had a similar tendency to those of p-type ZnSe thin films.

In forming a p-type ZnS$_x$Se$_{1-x}$ thin film of low resistivity ($0 \leq x < 1$) it is important to lead a zinc-containing compound, a sulfur containing compound, a selenium-containing compound and an nitrogen-containing dopant in the form of molecular beams onto the surface of a substrate, for example, by a MOMBE process, and to supply a group-V element as p type dopant under such a condition that a group VI element vacancy can be readily formed, thereby decomposing the compound at the surface of the substrate and introducing the electrically active nitrogen into the thin film more efficiently.

When the group-II element source is supplied in excess of the group-VI element source in the crystal growth of a ZnS$_x$Se$_{1-x}$, where $0 \leq x < 1$, the group-VI element vacancy is readily formed. The condition that the group-II element source is supplied in excess of the group-VI element source depends on the structure and shape of the individual crystal growth chambers and cannot be given directly by a ratio of the amount of supply of a group-II element source to that of a group-VI element source from the outside. When a relationship between the amount of supply of the group-VI element source and the growth rate of a ZnSSe thin film was investigated while keeping the amount of supply of group-II element source constant, it was found that the growth rate was proportional to the amount of the supply of group-VI element source in such a range that the amount of supply of group-VI element source was small, and when the amount of the group-VI element source exceeded some value, the growth rate became independent from the amount of supply of the group-VI element source and became constant. The former is in a range limited by the supply of the group-VI element source and corresponds to such a condition that the group-II element source is supplied in excess of the group-VI element source.

In most of crystal growth elements, the range limited by the supply of the group-VI element source corresponds to a source molar ratio of a group-VI element source/group-II element source of not more than 5, preferably not more than 4. Since the crystal growth rate is lower in too low a source molar ratio, the source molar ratio is preferably not less than 0.1.

When the group-V element source is supplied under such a condition that the crystal growth rate is limited by the amount of supply of the group-VI element source, as explained above, substitution of a group-V element takes place at the lattice sites of the group-VI element and the substituent group-V element acts as an acceptor. Thus, an efficient p-type semiconductor thin film of low resistivity can be obtained.

As to vapor pressure of a constituent element of ZnSSe, the group-VI elements, sulfur and selenium, have a higher vapor pressure than the group-II element zinc. Thus, the vacancy is readily formed at the lattice sites of group-VI element with increasing substrate temperature. When the group-V element source is supplied to the lattice sites of group-VI element, substitution of a group-V element takes place at the lattice site of the group VI element, and the substituent group-V element acts as an efficient acceptor. At too high a substrate temperature, the crystal growth rate is decreased and the crystallinity is deteriorated. Thus, the substrate temperature is preferably in a range of 350° to 700° C., more preferably 400° to 600° C.

The lower the pressure in the growth chamber during the crystal growth, the more readily the vacancy is formed at the lattice sites of group-VI element. Thus, the pressure is preferably not more than 0.1 Torr.

Furthermore, the value $x$ in the ZnS$_x$Se$_{1-x}$ is in a range of $0 \leq x < 1$, and preferably $0 \leq x \leq 0.68$ to bring the lattice constant in agreement with that of the substrate.

Examples of the present invention will be described in detail below.

EXAMPLE 1

Figure 6:
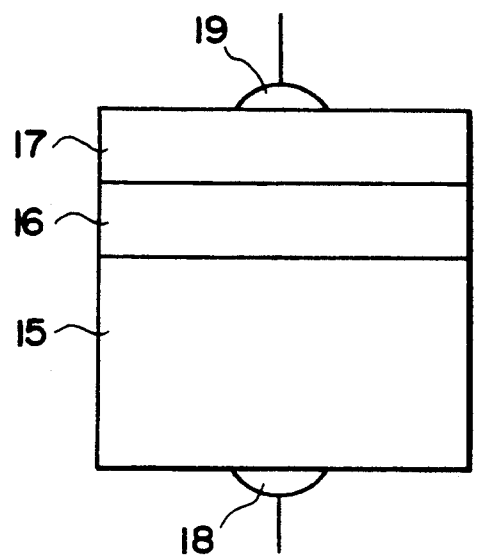
FIG. 6 shows the structure of an emitting device according to one embodiment of the present invention.

FIG. 6 shows the cross section of a semiconductor emitting device according to one embodiment of the present invention. On an n-type GaAs substrate 15 were formed an iodine-doped n-type ZnSe layer 16 to a thickness of 1.0 μm and successively a nitrogen-doped p-type ZnSe layer 17 to a thickness of 1.0 μm by a MOMBE process, where DMZ and H$_2$Se were used as a Zn source and a Se source, respectively, and methyliodine (CH$_3$I) and NH$_3$ were used as an n-type dopant source and a p-type dopant source, respectively. The substrate temperature was 400° C. and flow rates of DMZ, H$_2$Se and CH$_3$I (or NH$_3$) were 20, 43 and 43 μmol/min., respectively. Under these conditions the group-II element source was in excess and thus substitution of iodine atoms or nitrogen atoms was liable to take place at the lattice sites of selenium atoms. An n-type (or p-type) ZnSe layer having a resistivity of not more than 1 Ω-cm was obtained and a good p-n junction was formed. The carrier concentration of p-type ZnSe layer was $1.0 \times 10^{17}$ cm$^{-3}$ in that case. Electrodes 18 and 19 were formed by the ordinary method to form a semiconductor emitting device. As the electrode material, Au or In could be used.

Figure 7:
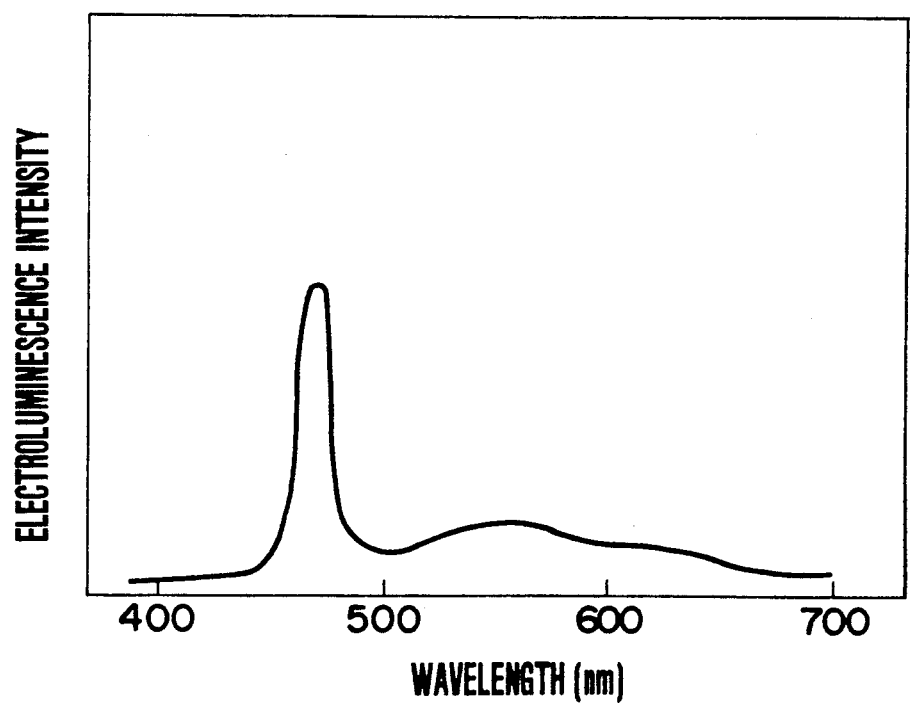
FIG. 7 is a diagram showing the emitting system of the device of FIG. 6.

FIG. 7 shows that an emitting spectrum of the thus formed semiconductor emitting device with a blue light electroluminescence having a wavelength of 470 nm was obtained, and the emitting device had a long life. In this Example, ZnSe was used as p-type and n-type semiconductors, and $ZnS_xSe_{1-x}$, where $0 \leq x < 1$, could be also used.

EXAMPLE 2

A cross-section of double-hetero junction structure according to one embodiment of the present semiconductor laser is shown in FIG. 8C, and band gap energy, refractive index and lattice constant of a semiconductor layer constituting the structure are shown in FIG. 8A, FIG. 8B and FIG. 8D, respectively.

On an n-type GaAs substrate 15 were successively formed an iodine-doped $ZnS_{0.08}Se_{0.92}$ layer 20 as a first n-type clad layer to a thickness of 1.0 μm, an undoped $ZnS_{0.65}Te_{0.35}$ layer 21 as an active layer to a thickness of 0.2 μm, and a nitrogen-doped $ZnS_{0.08}Se_{0.92}$ layer 22 as a second p-type clad layer to a thickness of 1.0 μm by a MOMBE process, where DMZ, $H_2S$, $H_2Se$ and $(C_2H_5)HTe$ were used as a Zn source, an S source, an Se source and a Te source, respectively, and methyliodine ($CH_3I$) and $NH_3$ were used as an n-type dopant source and a p-type dopant source, respectively. The substrate temperature was 400° C. and flow rates of DMZ, $NH_3$ and $CH_3I$ were 20, 43 and 43 μmol/min., respectively. In this manner, a semiconductor laser satisfying the double-hetero junction structure having a band gap energy difference of 0.4 eV and a refractive index difference of 0.25 between the clad layers and the active layer was prepared. The device had a long life and could be prepared with good reproducibility. The carrier concentration and resistivity of p-type clad layers were $1.0 \times 10^{17} cm^{-3}$ and 1 Ω-cm, respectively.

In the present semiconductor laser, the lattice constants of the respective semiconductors constituting the active layer, the first and second clad layers and the substrate are substantially matched to one another. For example, it is preferable that the lattice mismatch at the boundary between the respective layers and between the substrate and the clad layer be within 0.3%.

In the present invention, a semiconductor emitting device of double-hetero junction structure comprising clad layers having a broader band gap energy ($E_G$) and an active layer having a narrower band gap energy, sandwiched therebetween was formed with mixed crystal of II-VI compound semiconductors to efficiently generate visible emission of 0.4 to 0.5 μm band covering blue light over to orange light.

Figure 9:
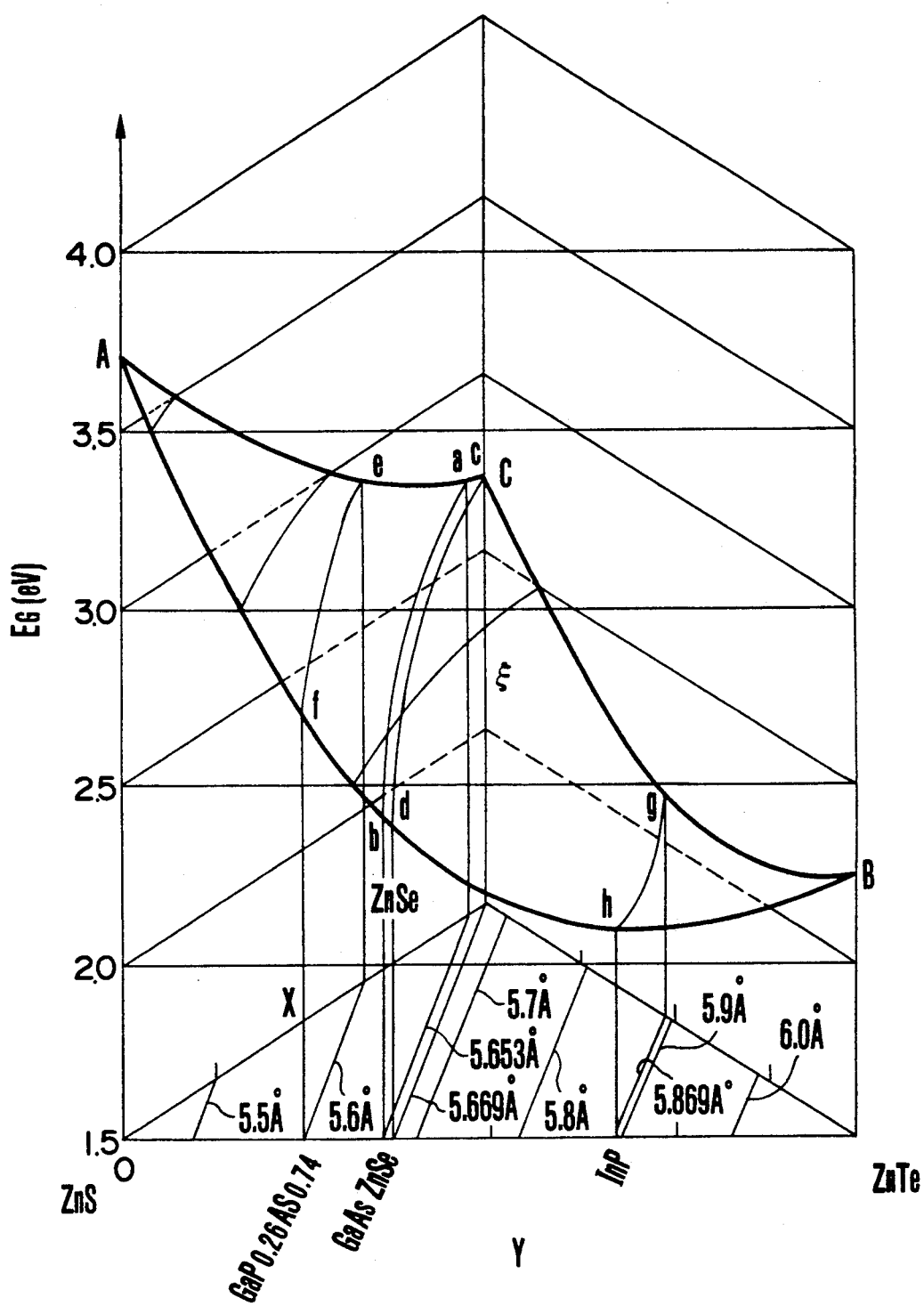
FIG. 9 is a diagram showing a relationship between the composition, the lattice constant and the band gap energy of $ZnS_xTe_ySe_{1-x-y}$ mixed crystal for use in the present semiconductor laser.

FIG. 9 shows a relationship between the composition (x, y) of a mixed crystal system of ZnS, ZnTe and ZnSe and the band gap energy ($E_G$). This relationship is disclosed in J. Phys. Chem. Solids, Vol. 24, pp 37–44 (1963), J. Phys. C: Solid State Phys., Vol. 6, p L115 (1973) and Phys. Rev. B., Vol. 6, p 3786 (1972).

Band gap energy ($E_G$) at composition (x, y) is given by a corresponding point on the curved surface ξ confined by three curves AB, BC and CA. For reference, various materials for use as the substrate are given on the sides of the corresponding lattice constant values. When n-type GaAs (100) is used as a substrate, the mixed crystal composition satisfying the corresponding lattice matching condition is given on the curved surface ξ along a curve a-b. When n-type InP (100) is used as a substrate, a curve g-h on the curved surface ξ gives a mixed crystal composition satisfying the lattice matching condition. From the thus selected mixed crystal compositions, combinations having a larger band gap energy of the clad layer than the band gap energy of the active layer, preferably by a difference of at least 0.2 eV can be found. The dielectric constant (refractive index) is increased with decreasing band gap energy ($G_G$) and thus a most suitable double-hetero structure can be formed. Formation of the most suitable double-hetero structure is due to the fact that the band gap energy ($E_G$) of mixed crystal has a nonlinear relationship with respect to a composition (x, y) (bowing phenomenon). For example, when GaAs is used as a substrate, the above-mentioned condition can be satisfied by using $ZnS_xTe_{1-x}$ ($0.62 \leq x \leq 0.68$) as an active layer and $ZnS_ySe_{1-y}$ ($0 \leq y \leq 0.14$) as a clad layer, or when ZnSe is used as a substrate, the above-mentioned condition can be satisfied by using $ZnS_xTe_{1-x}$ ($0.58 \leq x \leq 0.68$) as an active layer and ZnSe as a clad layer. Besides the above-mentioned combinations, many semiconductor combinations satisfying the above-mentioned condition, using a substrate of zinc blende (ZB) structure having a lattice constant of 5.49 Å to 5.67 Å are available, where $ZnS_xTe_{1-x}$ ($0.58 \leq x \leq 0.88$) and $ZnS_ySe_{1-y}$ ($0 \leq x \leq 0.68$) are used.

EXAMPLE 3

A cross-section of a semiconductor laser according to a third embodiment of the present invention is shown in FIG. 10C, and the band gap energy, refractive index and lattice constant of a semiconductor of the foregoing cross-section are shown in FIG. 10A, FIG. 10B and FIG. 10D, respectively, where DMZ, $(C_2H_5)_2S$, $(C_2H_5)_2Se$ and $(CeH_5)_2Te$ were used as a Zn source, as S source, an Se source and a Te source, respectively, and $C_8H_{17}I$ and $NH_3$ were used as an n-type dopant source and a p-type dopant source, respectively, and the crystal was made to grow at a substrate temperature of 400° C. by a MOMBE process.

Figure 11A:
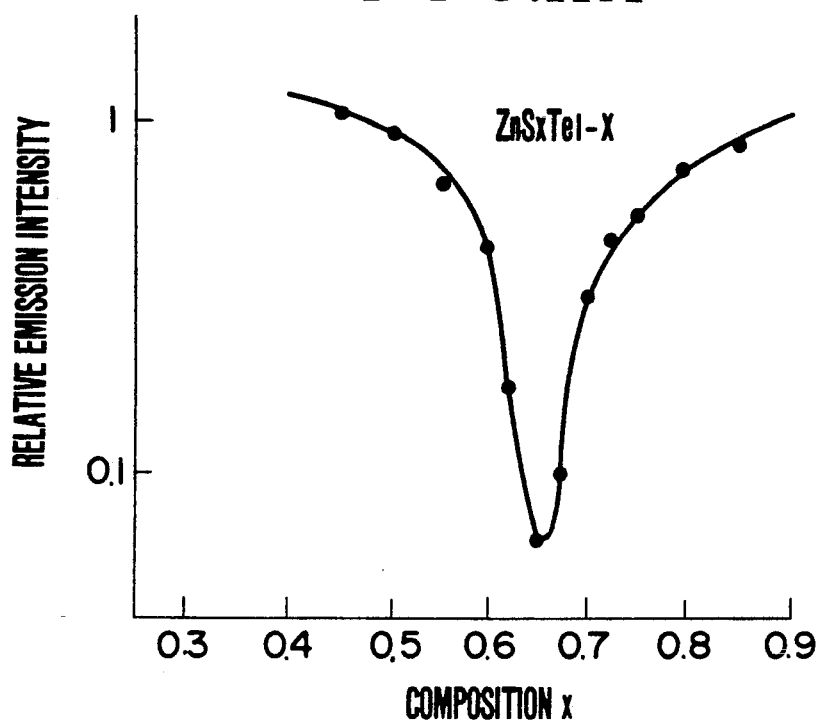
FIG. 11A is a diagram showing a relationship between the composition x of $ZnS_xTe_{1-x}$ and the relative emission intensity of the semiconductor laser.

That is, on a p-type GaAs (100) substrate 15 was at first formed a p-type $ZnS_{0.08}Se_{0.92}$ thin film as a first clad layer 22 to a thickness of 0.5 μm. The half width full height of X-ray locking curve of the thus formed thin film was 0.057 degrees. Then, a substantially undoped $ZnS_xTe_{1-x}$ thin film was formed thereon as an active layer 21 to a thickness of 0.02 μm. By changing a flow rate ratio of $(C_2H_5)_2S$ to $(C_2H_5)_2Te$, the composition x was changed in a range of $0.4 \leq x \leq 0.9$ to form the thin film. By exposing the thin film to an argon laser having a wavelength of 518 nm, the deep-level emission intensity became minimum at the composition $x = 0.65$ (FIG. 11A). The band-edge emission intensity became 25 times that of the film at $x = 0.6$. These compositions correspond to point a and point b in FIG. 9 and can match with the lattice constant of substrate GaAs (100).

Then, an n-type $ZnS_{0.08}Se_{0.92}$ thin film was formed thereon as a second clad layer 20 to a thickness of 0.3 μm.

In this structure, the first clad layer 22 of p-type $ZnS_{0.08}Se_{0.92}$ thin film, the second clad layer 20 of n-type $ZnS_{0.08}Se_{0.92}$ thin film and the active layer 21 of substantially undoped $ZnS_{0.65}Te_{0.35}$ had band gap energys ($E_G$) of 2.30 eV, 2.30 eV and 2.70 eV, respectively, and refractive indice n at 538 nm of 2.50, 2.50 and 2.75, respectively. The requirements for the semiconductor laser double-hetero junction structure, i.e. a band gap energy difference $\Delta E_G \geq 0.2$ eV and a refractive index difference $\Delta n \geq 0.2$, could be satisfied by this structure.

Figure 11B:
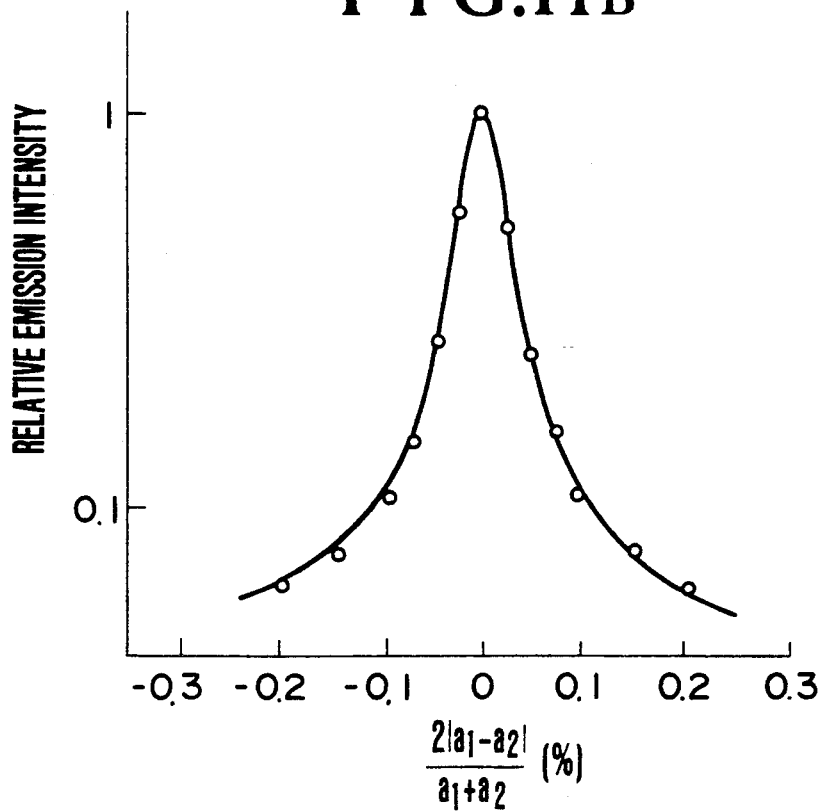
FIG. 11B is a diagram showing correlation between the lattice mismatch of clad layer and active layer and the relative emission intensity of the semiconductor laser.

FIG. 11B shows a relative emission intensity to lattice mismatch $2|a_1 - a_2|/(a_1 + a_2)$, represented by the lattice constant $a_1$ of clad layer and lattice constant $a_2$ of active layer in various devices formed while changing the composition X of the active layer in a range of 0.6

$\leq x \leq 0.7$. When the lattice mismatch exceeds 0.3%, no laser oscillation takes place, and particularly preferable lattice mismatch limit is within 0.05%.

A green light semiconductor laser was realized by the materials and structure given in this Example.

EXAMPLE 4

Figures 12A, 12B, 12C, 12D:
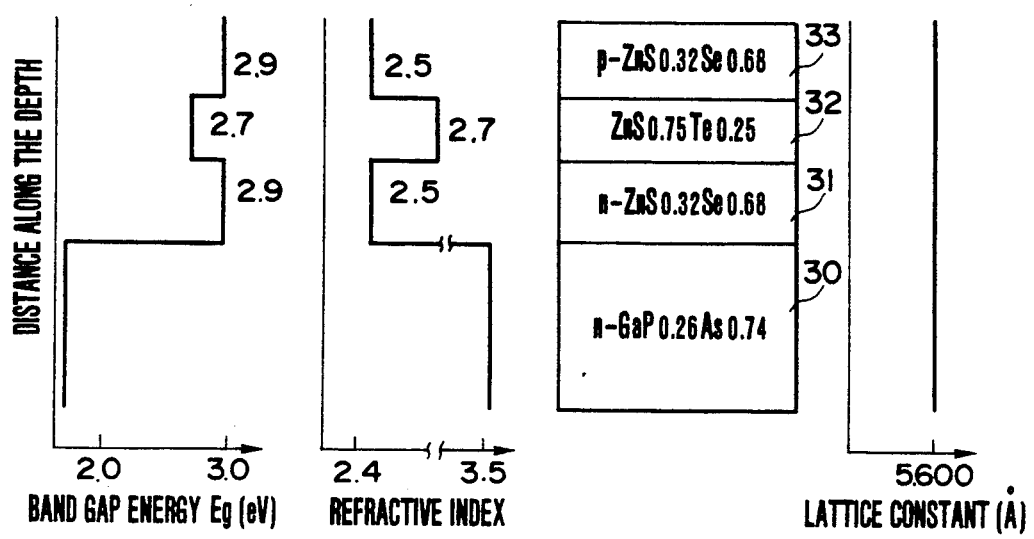

A double-hetero junction structure of first and second clad layers 31 and 33 of point e composition in FIG. 9, i.e. $ZnS_{0.32}Se_{0.68}$ and an active layer 32 q point f composition in FIG. 9, i.e. $ZnS_{0.75}Te_{0.25}$ was formed on a substrate 30 of n-type $GaP_{0.26}As_{0.74}$ having a lattice constant of 5.60 Å in the same manner as in Example 2. The cross-section of the double-hetero junction structure is shown in FIG. 12C, and band gap energy, refractive index and lattice constant of the semiconductor layers constituting the double-hetero junction structure are shown in FIG. 12A, FIG. 12B and FIG. 12D. The band gap energy difference $\Delta E_G$ between the clad layer and the active layer was 0.2 eV or more and the refractive index difference $\Delta n$ (470 nm) therebetween was 0.2, and thus the requirements for the double-hetero junction structure semiconductor laser were satisfied thereby. A blue color visible semiconductor laser having an emission at 470 nm was obtained by the materials and structure given in this Example.

EXAMPLE 5

Figures 13A, 13B, 13C, 13D:
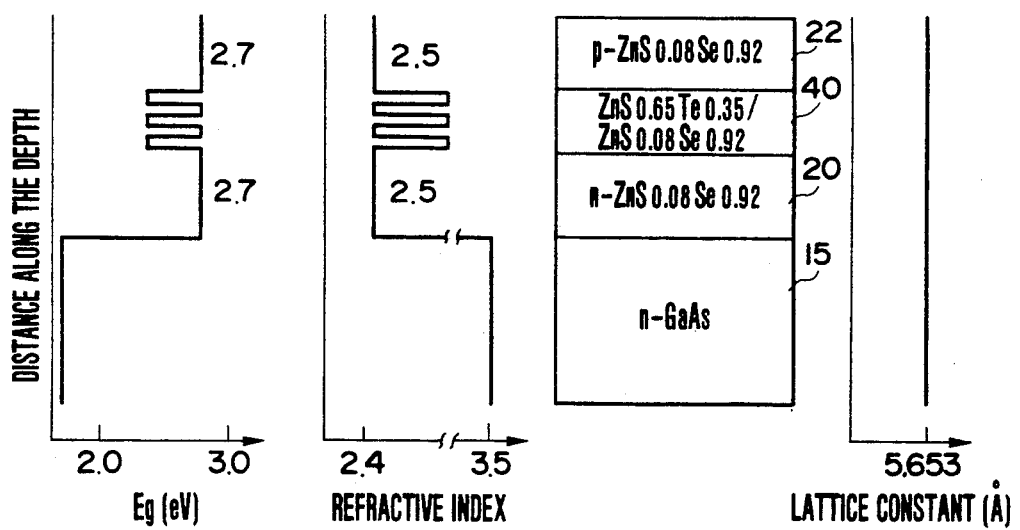

In preparing a double-hetero junction semiconductor laser in the same manner as in Example 2, a superlattice structure of $ZnS_{0.08}Se_{0.92}/ZnS_{0.65}Te_{0.35}$, lattice-matched with GaAs (100) of substrate 15 was used as an active layer 40. The thicknesses of $ZnS_{0.08}Se_{0.92}$ thin film and $ZnS_{0.65}Te_{0.35}$ thin film were 100 Å and 30 Å, respectively, and 5 layers each of these thin films were alternately laminated to form the active layer 40 in the double-hetero structure. The cross-section of the double-hetero structure is shown in FIG. 13C and band gap energy, refractive index and lattice constant of the semiconductor layers constituting the double-hetero structure are shown in FIG. 13A, FIG. 13B and FIG. 13D, respectively. The emitting wavelength of the present device was in a blue color region of 478 nm, and the requirements for the double-hetero structure semiconductor laser were satisfied in this Example. A blue color, visible semiconductor laser was obtained.

EXAMPLE 6

Double-hetero junction structures were formed on an n-type ZnSe (100) substrate 50 and an n-type InP (100) substrate 60, respectively, in the same manner as in Example 2.

In the case of ZnSe substrate 50, first and second clad layers 51 and 53 had a point a composition of ZnSe and an active layer 52 had a point d composition of substantially undoped $ZnS_{0.63}Te_{0.37}$. In the case of InP substrate 60, first and second clad layers 61 and 63 had a point g composition of $ZnS_{0.34}Te_{0.66}$ and an active layer 62 had a point h composition of $ZnSe_{0.54}Te_{0.46}$.

Figures 14A, 14B, 14C, 14D:
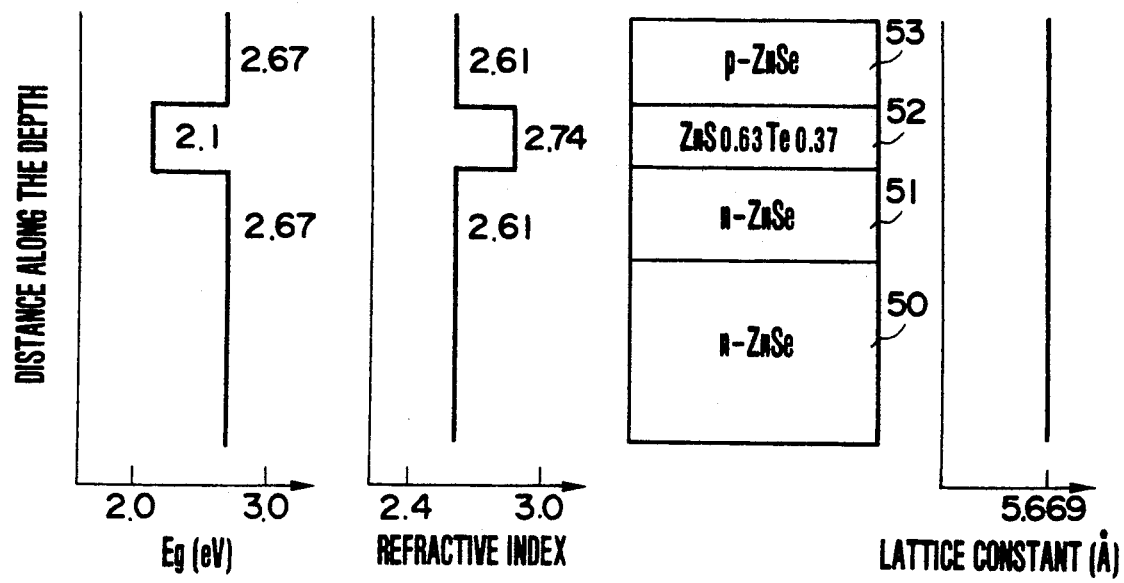
Figures 15A, 15B, 15C, 15D:
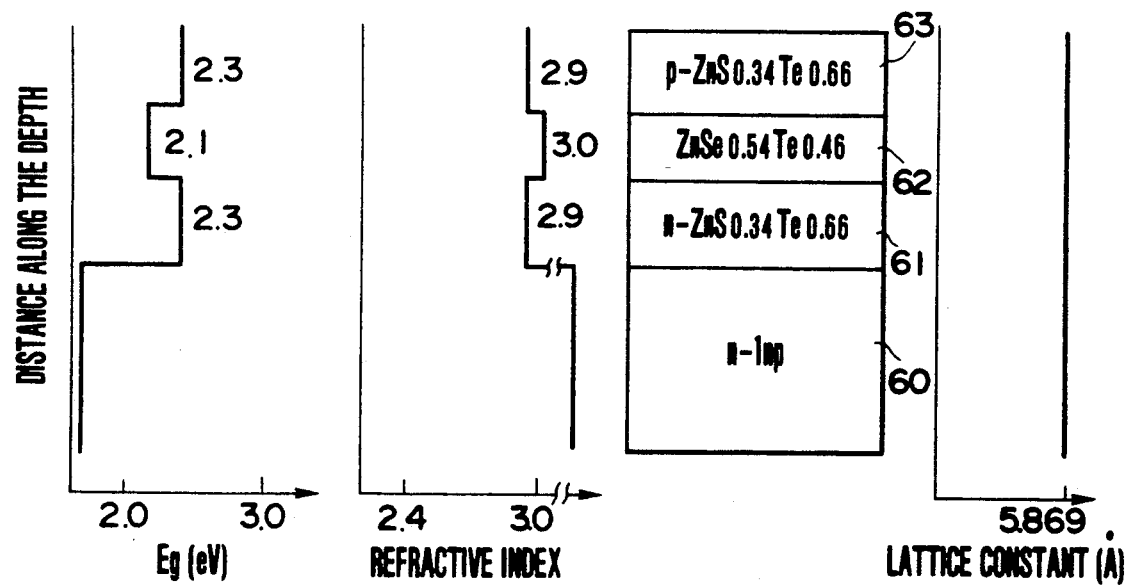

Cross-sections of the double-hetero structures are shown in FIG. 14C and FIG. 15C, respectively, and the band gap energy ($E_G$), refractive index and lattice constant of the semiconductor layers constituting the double-hetero structures are shown in FIG. 14A and FIG. 15A, FIG. 14B and FIG. 15B and FIG. 14D and FIG. 15D, respectively. The requirements for the double-hetero structure semiconductor laser were satisfied in this Example, and orange color visible semiconductor lasers were obtained.

According to the present invention, a p-type ZnSSe thin film of low resistivity can be formed, and semiconductor emitting devices capable of emitting a blue color over to an orange color can be obtained by forming a good p n junction with the thus formed p-type thin film. Furthermore, semiconductor lasers capable of emitting a blue color over to an orange color can be obtained. The present invention can provide semiconductor lasers applicable to a plastic fiber light source, a high density optical disk light source, a multi-color LED-substitute light source, a display light source, a high sensitivity laser printer light source, etc.

What is claimed is:

1. A semiconductor emitting device, which comprises:
    a substrate comprised of GaPAs;
    a double hetero junction structure of II–VI compound semiconductors formed on said substrate, said double hetero junction structure comprising a first cladding layer of n-type conductivity, a second cladding layer of p-type conductivity and an active layer located between said first and second cladding layers; and
    first and second electrodes electrically connected to said first and second cladding layers, respectively.

2. A semiconductor emitting device according to claim 1, wherein said second cladding layer has a carrier concentration of not less than $1 \times 10^{16}$ cm$^{-3}$ at room temperature.

3. A semiconductor emitting device according to claim 2, wherein said second cladding layer has a resistivity of not more than 10 Ω-cm at room temperature.

4. A semiconductor emitting device according to claim 3, wherein said carrier concentration is not less than $1 \times 10^{17}$ cm$^{-3}$ and said resistivity is not more than 1 Ω-cm at room temperature.

5. A semiconductor emitting device according to claim 4, wherein said second cladding layer has nitrogen atoms as a dopant.

6. A semiconductor emitting device according to claim 3, wherein said active layer is comprised of ZnSTe, said first cladding layer is comprised of n-type ZnSSe, and said second cladding layer is comprised of p-type ZnSSe.

7. A semiconductor emitting device according to claim 6, wherein said second cladding layer has nitrogen atoms as a dopant.

8. A semiconductor emitting device according to claim 1, wherein said active layer is comprised of ZnSTe, said first cladding layer is comprised of n-type ZnSSe, and a second cladding layer is comprised of p-type ZnSSe.

9. A semiconductor emitting device according to claim 8, wherein said second cladding layer has nitrogen atoms as a dopant, said carrier concentration is not less than $1 \times 10^{17}$ cm$^{-3}$, and said resistivity is not more than 1 Ω-cm at room temperature.

10. A semiconductor emitting device, which comprises:
    a substrate;
    a double hetero junction structure of II–VI compound semiconductors formed on said substrate, said double hetero junction structure comprising a first cladding layer of n-type conductivity, a second cladding layer of p-type conductivity and an active layer between said first and second cladding layers, said active layer being comprised of ZnSeTe; and first and second electrodes electrically connected to said first and second cladding layers, respectively.

11. A semiconductor emitting device according to claim 10, wherein said first cladding layer is comprised of n-type ZnSTe, and second cladding layer is comprised of p-type ZnSTe.

12. A semiconductor emitting device according to claim 10, wherein said second cladding layer has a carrier concentration of not less than $1 \times 10^{16}$ cm$^{-3}$ at room temperature.

13. A semiconductor emitting device according to claim 12, wherein sad second cladding layer has a resistivity of not more than 10 Ω-cm at room temperature.

14. A semiconductor emitting device according to claim 13, wherein said carrier concentration is not less than $1 \times 10^{17}$ cm$^{-3}$ and said resistivity is not more than 1 Ω-cm at room temperature.

15. A semiconductor emitting device according to claim 14, wherein said substrate is composed of InP.

16. A semiconductor emitting device according to claim 13, wherein said second cladding layer has nitrogen atoms as a dopant.

17. A semiconductor emitting device according to claim 11, wherein said second cladding layer has nitrogen atoms as a dopant.

18. A semiconductor emitting device according to claim 11, wherein said second cladding layer has a carrier concentration of not less than $1 \times 10^{16}$ cm$^{-3}$ at room temperature.

19. A semiconductor emitting device according to claim 18, wherein said substrate is comprised of InP.

20. A semiconductor emitting device according to claim 19, wherein said second cladding layer has nitrogen atoms as a dopant, said carrier concentration is not less than $1 \times 10^{17}$ cm$^{-3}$, and said resistivity is not more than 1 Ω-cm at room temperature.

21. A semiconductor emitting device which comprises:

a substrate a double hetero junction structure of II–VI compound semiconductors formed on said substrate, said double hetero junction structure comprising a first cladding layer of n-type conductivity, a second cladding layer of p-type conductivity and an active layer between said first and second cladding layer, said second cladding layer being comprised of nitrogen-doped ZnSTe and having a carrier concentration of not less than $1 \times 10^{16}$ cm$^{-3}$ at room temperature; and first and second electrodes electrically connected to said first and second cladding layers, respectively.

22. A semiconductor emitting device according to claim 21, wherein said second cladding layer has a resistivity of not more than 10 Ω-cm at room temperature.

23. A semiconductor emitting device according to claim 22, wherein said carrier concentration is not less than $1 \times 10^{17}$ cm$^{-3}$ and said resistivity is not more than 1 Ω-cm at room temperature.

24. A semiconductor emitting device, which comprises:

a substrate;

a double hetero junction structure of II–VI compound semiconductors formed on said substrate, said double hetero junction structure comprising a first cladding layer of n-type conductivity, a second cladding layer of p-type conductivity and an active layer between said first and second cladding layers, said second cladding layer being comprised of nitrogen-doped II–VI compound semiconductor and having a carrier concentration of not less than $1 \times 10^{17}$ cm$^{-3}$ and a resistivity of not more than 1 Ω-cm at room temperature; and first and second electrodes electrically connected to said first and second cladding layers, respectively.

25. A semiconductor emitting device according to claim 24, wherein said second cladding layer is ZnSSe.

26. A semiconductor emitting device, which comprises:

a semiconductor substrate of n-type conductivity;

a double hetero junction structure of II–VI compound semiconductors formed on said semiconductor substrate, said double hetero junction structure comprising a first cladding layer of n-type conductivity formed on said semiconductor substrate, an active layer formed on said first cladding layer, and a second cladding layer of p-type conductivity formed on said active layer; and first and second electrodes electrically connected to said first and second cladding layers, respectively;

wherein said first cladding layer is comprised of $ZnS_zSe_{1-z}$, where $0 \leq z \leq 0.68$, said active layer is comprised of $ZnS_yTe_{1-y}$, wherein $0.58 \leq y \leq 0.88$, and said second cladding layer is comprised of nitrogen-doped $ZnS_xSe_{1-x}$, where $0 \leq x \leq 1$ and has a carrier concentration of not less than $1 \times 10^{16}$ cm$^{-3}$ at room temperature.

27. A semiconductor emitting device according to claim 26, wherein said second cladding layer has a resistivity of not more than 10 Ω-cm at room temperature.

28. A semiconductor emitting device according to claim 27, wherein said carrier concentration is not less than $1 \times 10^{17}$ cm$^{-3}$ and said resistivity is not more than 1 Ω-cm at room temperature.

29. A semiconductor emitting device according to claim 26, wherein said substrate is comprised of ZnSe.

30. A semiconductor emitting device according to claim 29, wherein said carrier concentration is not less than $1 \times 10^{17}$ cm$^{-3}$ and said resistivity is not more than 1 Ω-cm at room temperature.

31. A semiconductor emitting device, which comprises:

a semiconductor substrate of n-type conductivity;

a double hetero junction structure of II–VI compound semiconductors formed on said substrate, said double hetero junction structure comprising a first cladding layer of n-type conductivity formed on said substrate, an active layer formed on said first cladding layer, and a second cladding layer of p-type conductivity formed on said active layer; and first and second electrodes electrically connected to said first and second cladding layers, respectively;

wherein said active layer is in a superlattice structure comprised of a lamination of a plurality of layers of $ZnS_yTe_{1-y}$ and $ZnS_zSe_{1-z}$, where $0.58 \leq y \leq 0.88$ and $0 \leq z \leq 0.68$, and said second cladding layer is comprised of nitrogen-doped $ZnS_xSe_{1-x}$, where $0 \leq x \leq 1$ and has a carrier concentration of not less than $1 \times 10^{16}$ cm$^{-3}$ at room temperature.

32. A semiconductor emitting device according to claim 31, wherein said second cladding layer has a resistivity of not more than 10 Ω-cm at room temperature.

33. A semiconductor emitting device according to claim 32, wherein said carrier concentration is not less than $1\times 10^{17} cm^{-3}$ and said resistivity is not more than 1 $\Omega$-cm at room temperature.

34. A semiconductor emitting device according to claim 31, wherein said substrate is comprised of ZnSe.

35. A semiconductor emitting device according to claim 34, wherein said carrier concentration is not less than $1\times 10^{17} cm^{-3}$ and said resistivity is not more than 1 $\Omega$-cm at room temperature.

36. A p-type semiconductor thin film represented by the general formula $ZnS_xSe_{1-x}$, where $0 \leq x \leq 1$ having a carrier concentration of not less than $1\times 10^{16} cm^{-3}$ and a resistivity of not more than 10 $\Omega$-cm at room temperature, and formed on a semiconductor substrate by leading a compound including a group-II element, a compound including a group-VI element, and a compound including nitrogen in the form of a molecular beam onto said semiconductor substrate and by chemical reactions between said compound including the group-II element and said compound including nitrogen and between said compound including the group-VI element and said compound including nitrogen.

37. A p-type semiconductor thin film according to claim 36, wherein said thin film of $ZnS_xSe_{1-x}$ is formed at a temperature of said semiconductor substrate of 350° to 700° C.

38. A p-type semiconductor thin film according to claim 36, wherein said compound including nitrogen is selected from group of ammonia, diethylamine and triethylamine.

39. A p-type semiconductor thin film according to claim 36, wherein a molar ratio of said group-II element to said group-VI element is 0.1 to 5.

* * * * *